United States Patent
Hsu et al.

(10) Patent No.: US 10,928,969 B2
(45) Date of Patent: Feb. 23, 2021

(54) INPUT DEVICE AND ELECTRONIC APPARATUS THEREWITH

(71) Applicant: Wistron Corporation, New Taipei (TW)

(72) Inventors: Wen-Chieh Hsu, New Taipei (TW); Yueh-Chou Sung, New Taipei (TW); Yi-Hsiang Su, New Taipei (TW)

(73) Assignee: Wistron Corporation, New Taipei (TW)

( * ) Notice: Subject to any disclaimer, the term of this patent is extended or adjusted under 35 U.S.C. 154(b) by 14 days.

(21) Appl. No.: 16/231,165

(22) Filed: Dec. 21, 2018

(65) Prior Publication Data
US 2020/0117298 A1 Apr. 16, 2020

(30) Foreign Application Priority Data
Oct. 11, 2018 (TW) ................................ 107135812

(51) Int. Cl.
*G06F 3/046* (2006.01)
*H03K 17/96* (2006.01)
*H03K 17/967* (2006.01)

(52) U.S. Cl.
CPC ........... *G06F 3/046* (2013.01); *H03K 17/964* (2013.01); *H03K 17/967* (2013.01); *H03K 2017/9613* (2013.01)

(58) Field of Classification Search
CPC ...... G06F 3/046; G06F 3/016; G06F 3/03547; H03K 17/964; H03K 17/967; H03K 2017/9613; H03K 17/965
See application file for complete search history.

(56) References Cited

U.S. PATENT DOCUMENTS

| | | | |
|---|---|---|---|
| 8,059,105 B2 | 11/2011 | Rosenberg | |
| 2003/0067449 A1 | 4/2003 | Yoshikawa | |
| 2008/0111788 A1* | 5/2008 | Rosenberg | A63F 13/06 345/156 |
| 2014/0049137 A1* | 2/2014 | Ando | G01L 1/16 310/330 |

(Continued)

FOREIGN PATENT DOCUMENTS

| | | |
|---|---|---|
| CN | 106444967 A | 2/2017 |
| TW | 201108063 | 3/2011 |

(Continued)

*Primary Examiner* — Jonathan A Boyd
(74) *Attorney, Agent, or Firm* — Winston Hsu (57) ABSTRACT

An input device includes a structural frame, a touch pad, a piezoelectric sheet fixed on the touch pad, and a controller electrically connected to the touch pad and the piezoelectric sheet. The touch pad has a first side, a second side opposite to the first side, and a touch-sensitive surface that has a button area located at the second side. The touch pad can be elastically deflected to move the second side relative to the structural frame. The piezoelectric sheet generates a voltage when the touch pad is elastically deflected. When determining that a press is performed on the button area and the voltage is larger than or equal to a corresponding predetermined value, the controller sends out a trigger signal. An electronic apparatus with the input device includes a display screen and a processor. The processor receives the trigger signal to control the display screen to display images.

22 Claims, 9 Drawing Sheets

(56) References Cited

U.S. PATENT DOCUMENTS

2017/0038801 A1\* 2/2017 Lee .................. G06F 1/1656
2018/0107378 A1\* 4/2018 Rosenberg .......... G06F 3/04883

FOREIGN PATENT DOCUMENTS

| TW | 201135567 A1 | 10/2011 |
| TW | I436261 | 5/2014 |
| TW | 201737277 | 10/2017 |

\* cited by examiner

INPUT DEVICE AND ELECTRONIC APPARATUS THEREWITH

BACKGROUND OF THE INVENTION

1. Field of the Invention

The present invention relates to an input device, and more particularly to a touch pad.

2. Description of the Prior Art

For conventional notebook computers, the touch pad thereof usually includes a touch area and two buttons and is capable of substituting a mouse. In some notebook computers, the touch pad thereof is realized by a single touch pad in coordination with a physical switch disposed below. When a user presses the touch pad to trigger the switch, the controller thereof will determine a touch position for the pressing and regard the operation of the user as a pressing operation on a left button or a right button accordingly. However, the switch is usually disposed at the middle of a side of the touch pad, resulting in that in principle when the user presses the touch pad at different locations with the same force, the portion of the touch pad corresponding to the switch will produce different displacements, of which some may be unable to trigger the switch effectively. On the other hand, if the user presses the touch pad not at the portion corresponding to the switch, the user needs to press with much force for ensuring that the switch can be triggered effectively, which is inconvenience for use.

SUMMARY OF THE INVENTION

The present disclosure provides an input device that uses a piezoelectric sheet to decide whether or not to send a signal representing that a button is triggered.

An input device according to an embodiment includes a structural frame, a touch pad, a piezoelectric sheet, and a controller. The touch pad has a first side, a second side, and a touch-sensitive surface. The first side and the second side are opposite. The first side is fixed on the structural frame. The touch-sensitive surface includes a button area. The button area is located at the second side. The touch pad is elastically deflectable to move the second side relative to the structural frame. The piezoelectric sheet is fixed on the touch pad. The piezoelectric sheet generates a voltage when the touch pad is elastically deflected. The controller is electrically connected to the touch pad and the piezoelectric sheet. Therein when the controller determines that a pressing is performed on the button area and the voltage is larger than or equal to a corresponding predetermined value, the controller sends out a trigger signal. Thereby, by designing the corresponding predetermined value, the controller can send the trigger signal effectively no matter where a user presses on the button area.

The present disclosure also provides an electronic apparatus, of which an input device uses a piezoelectric sheet to decide whether or not to send a signal representing that a button is triggered.

An electronic apparatus according to an embodiment includes a display screen, an input device, and a processor. The input device includes a structural frame, a touch pad, a piezoelectric sheet, and a controller. The processor is electrically connected to the display screen and the controller of the input device. The touch pad has a first side, a second side, and a touch-sensitive surface. The first side and the second side are opposite. The first side is fixed on the structural frame. The touch-sensitive surface includes a button area. The button area is located at the second side. The touch pad is elastically deflectable to move the second side relative to the structural frame. The piezoelectric sheet is fixed on the touch pad. The piezoelectric sheet generates a voltage when the touch pad is elastically deflected. The controller is electrically connected to the touch pad and the piezoelectric sheet. Therein, when the controller determines that a pressing is performed on the button area and the voltage is larger than or equal to a corresponding predetermined value, the controller sends out a trigger signal. The processor receives the trigger signal to control the display screen to display images. Thereby, by designing the corresponding predetermined value, the controller can send the trigger signal effectively no matter where a user presses on the button area. The processor can accurately respond to the operation of the user accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
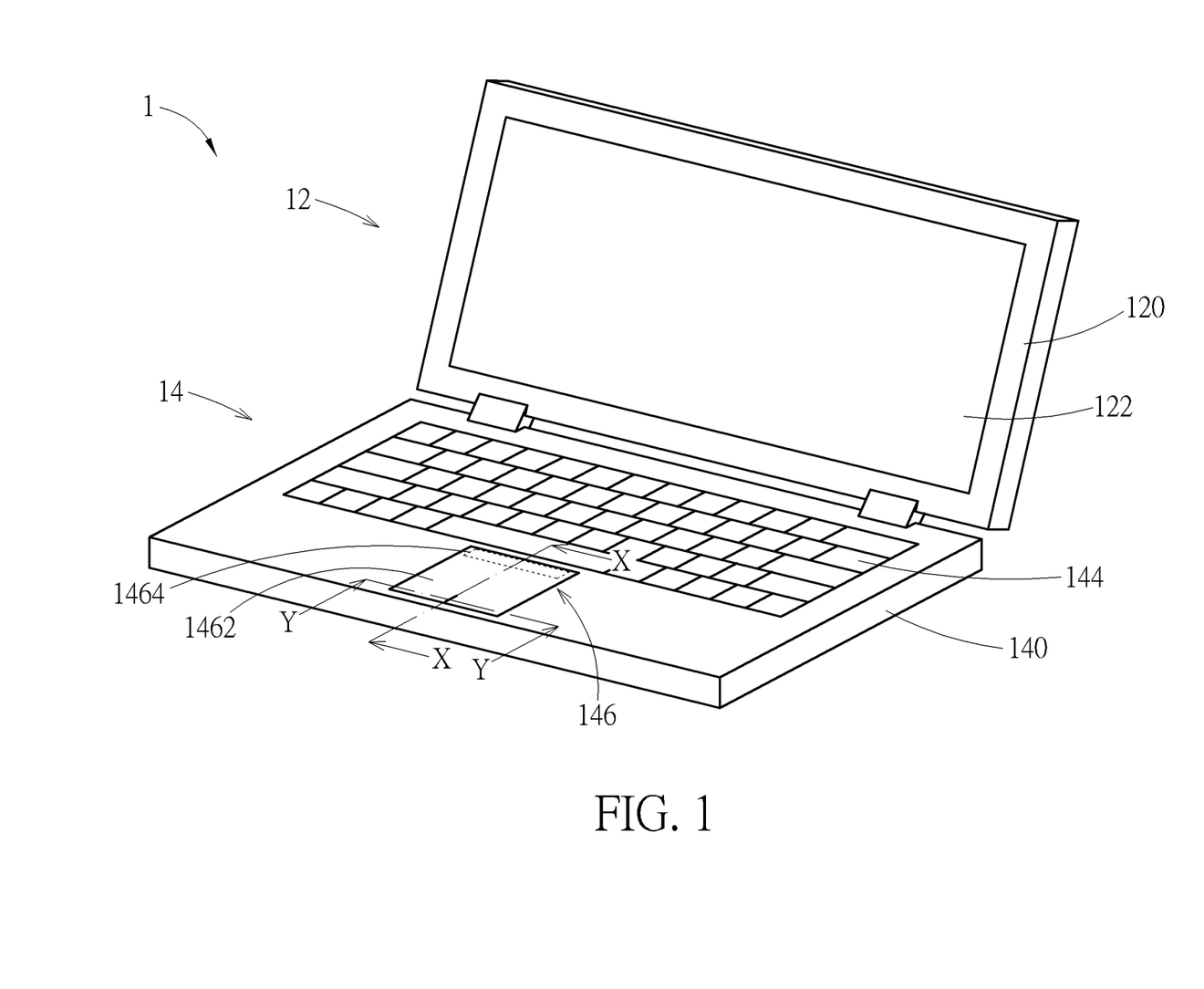
FIG. 1 is a schematic diagram illustrating an electronic apparatus according to an embodiment.
Figure 2:
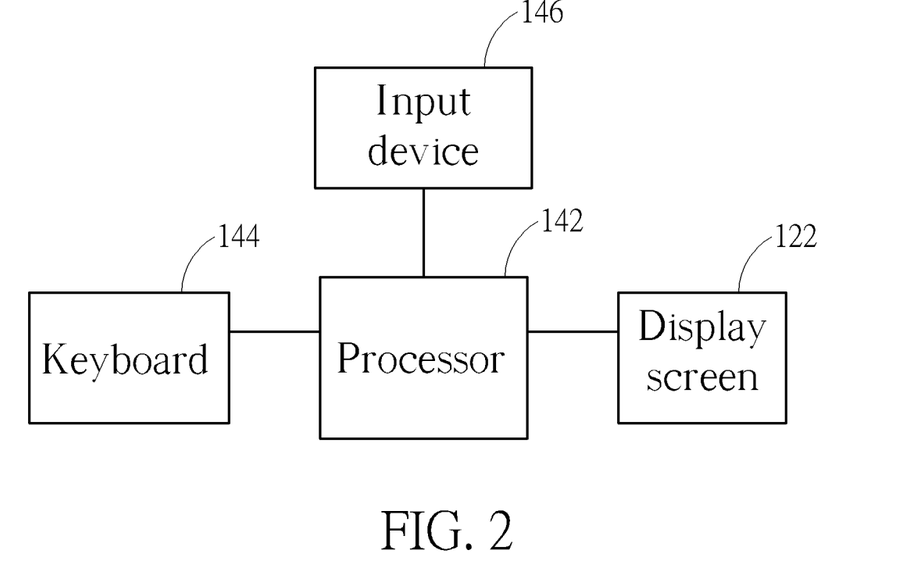
FIG. 2 is a functional block diagram of the electronic apparatus in FIG. 1.

Please refer to FIG. 1 and FIG. 2. An electronic apparatus 1 (e.g. but not limited to a notebook computer) according to an embodiment includes a first device body 12 and a second device body 14 connected with the first device body 12. The first device body 12 includes a first casing 120 and a display screen 122 (e.g. but not limited to a liquid crystal display) accommodated in the first casing 120. The second device body 14 includes a second casing 140, and a processor 142, a keyboard 144, and an input device 146 which are accommodated in the second casing 140. The first device body 12 is pivotally connected to the second casing 140. The processor 142 is electrically connected to the display screen 122, the keyboard 144, and the input device 146. The processor 142 can control the operation of the display screen 122. The processor 142 receives inputs from the keyboard 144 and the input device 146 and responds thereto (e.g. by controlling the display screen 122 to display images). In the embodiment, other descriptions for the electronic apparatus 1 can refer to relevant descriptions about components of common notebook computers and functions thereof and will not be described in addition. For example, the processor 142 can be realized by a circuit board module (e.g. including a printed circuit board and processing chips, memory, and other components which are electrically fixed on the printed circuit board). For example, the electronic apparatus 1 further includes a storage device (e.g. a hard disk), peripheral connection interfaces and so on (not shown in the figures).

Figure 3:
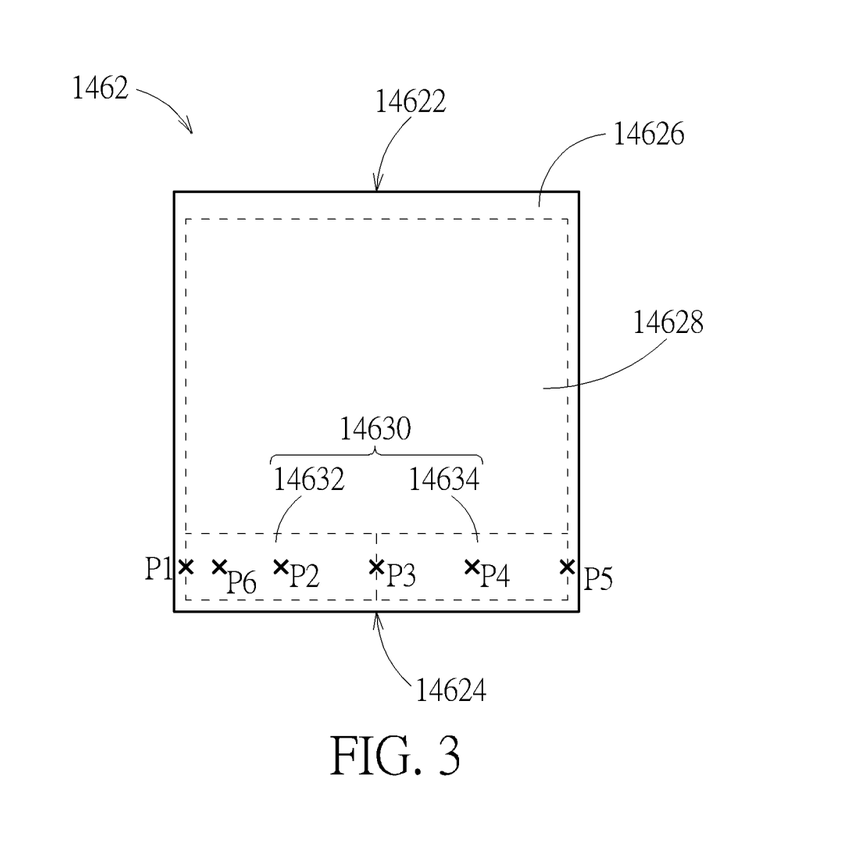
FIG. 3 is a top view of a touch pad of an input device of the electronic apparatus in FIG. 1.
Figure 4:
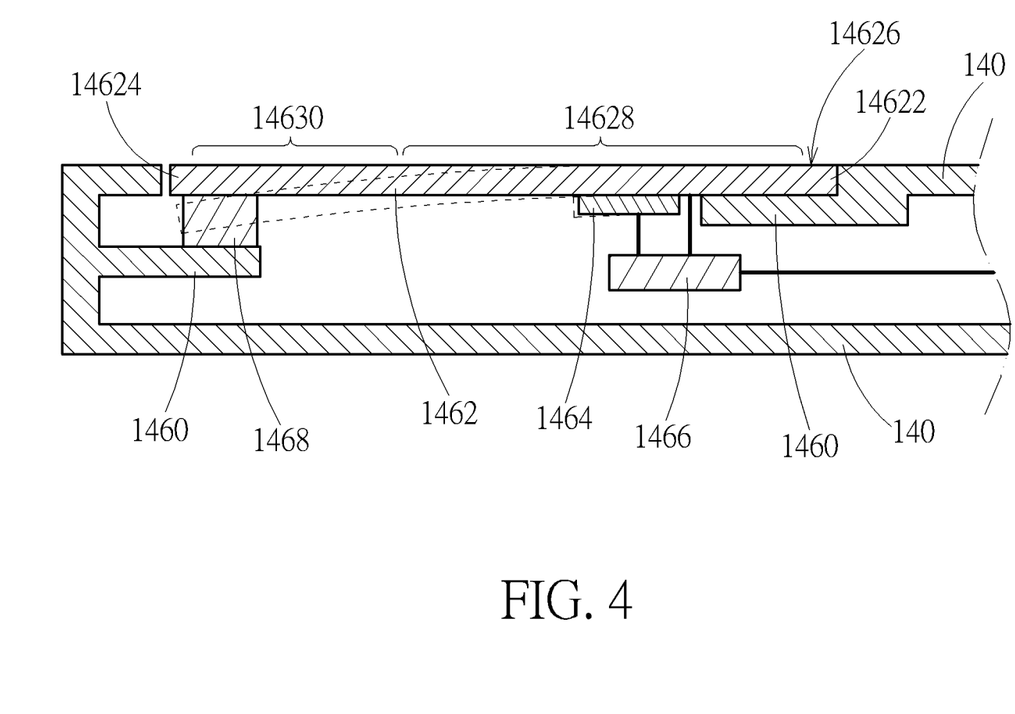
FIG. 4 is a sectional view of the electronic apparatus along the line X-X in FIG. 1.

Please also refer to FIG. 3 and FIG. 4. The input device 146 includes a structural frame 1460, a touch pad 1462, a piezoelectric sheet 1464, and a controller 1466. For simplification of description, in the embodiment, the structural frame 1460 is part of the second casing 140, so they are shown in the same pattern in the figure. However, in practice, the structural frame 1460 can be a separate part from the second casing 140 and then join with the second casing 140. The touch pad 1462 has a first side 14622, a second side 14624, and a touch-sensitive surface 14626. The first side 14622 and the second side 14624 are opposite. The touch-sensitive surface 14626 is located on the top surface of the touch pad 1462 for receiving operations of touching and pressing by a user. The touch-sensitive surface 14626 includes a movement area 14628 and a button area 14630 (of which the extent is indicated by rectangles in dashed lines in FIG. 3). The button area 14630 is located between the movement area 14628 and the second side 14624. Relative to the structural frame 1460, the touch pad 1462 is fixed on the structural frame 1460 through the first side 14622 in a structural form of cantilever, so the touch pad 1462 is elastically deflectable to move the second side 14624 relative to the structural frame 1460. In FIG. 4, the deflected touch pad 1462 is shown in dashed lines. The piezoelectric sheet 1464 is fixed on the lower surface of the touch pad 1462; thereby, the piezoelectric sheet 1464 deforms as the touch pad 1462 deflects. Under piezoelectric effect, the piezoelectric sheet 1464 will generate a voltage when the touch pad 1462 is elastically deflected. In the embodiment, the piezoelectric sheet 1464 is close to the first side 14622. The piezoelectric sheet 1464 is provided in a strip and extends parallel to the first side 14622, but not limited thereto in practice. The controller 1466 is electrically connected to the touch pad 1462 and the piezoelectric sheet 1464 (indicated by bold lines in FIG. 4); thereby, the controller 1466 can receive touch-sensing signals from the touch pad 1462 and voltage signals from the piezoelectric sheet 1464 (i.e. detecting the above voltage). The controller 1466 is also electrically connected to the processor 142 (indicated by a bold line in FIG. 4). In practice, the controller 1466 can be realized by a circuit board module (e.g. including a printed circuit board and processing chips, memory, and other components which are electrically fixed on the printed circuit board).

When the user presses the touch pad 1462 at different locations with the same force, the touch pad 1462 will produce different deflections, and the piezoelectric sheet 1464 will generate different voltages. Thereby, it is practicable to decide whether or not to respond to a pressing by the user according to a corresponding predetermined value stored by the controller 1466 in advance. In the embodiment, the button area 14630 includes a left button sub-area 14632 and a right button sub-area 14634 (i.e. corresponding to a left button and a right button of a mouse). The controller 1466 will respond to a pressing on the left button sub-area 14632 and the right button sub-area 14634 by the user in principle. Accordingly, the controller 1466 will store predetermined values corresponding to different portions of the left button sub-area 14632 and the right button sub-area 14634 in advance. For example, as shown by FIG. 3, five positions P1-P5 (indicated by cross marks in FIG. 3) on the button area 14630 are taken as exemplars for setting corresponding predetermined values relative to the button area 14630. A constant force (e.g. about 165 gw) can be applied to the button area 14630 at the positions P1-P5. Then, corresponding voltages generated by the piezoelectric sheet 1464 can be detected, e.g. 6V, 3V, 4V, 3V and 6V respectively which can be taken as predetermined values corresponding to the five positions P1-P5 on the button area 14630. The above corresponding predetermined values can be set before leaving the factory, but not limited thereto in practice. Furthermore, in practice, it is practicable to select more positions on the button area 14630 for setting corresponding predetermined values relative to the button area 14630.

Figure 5:
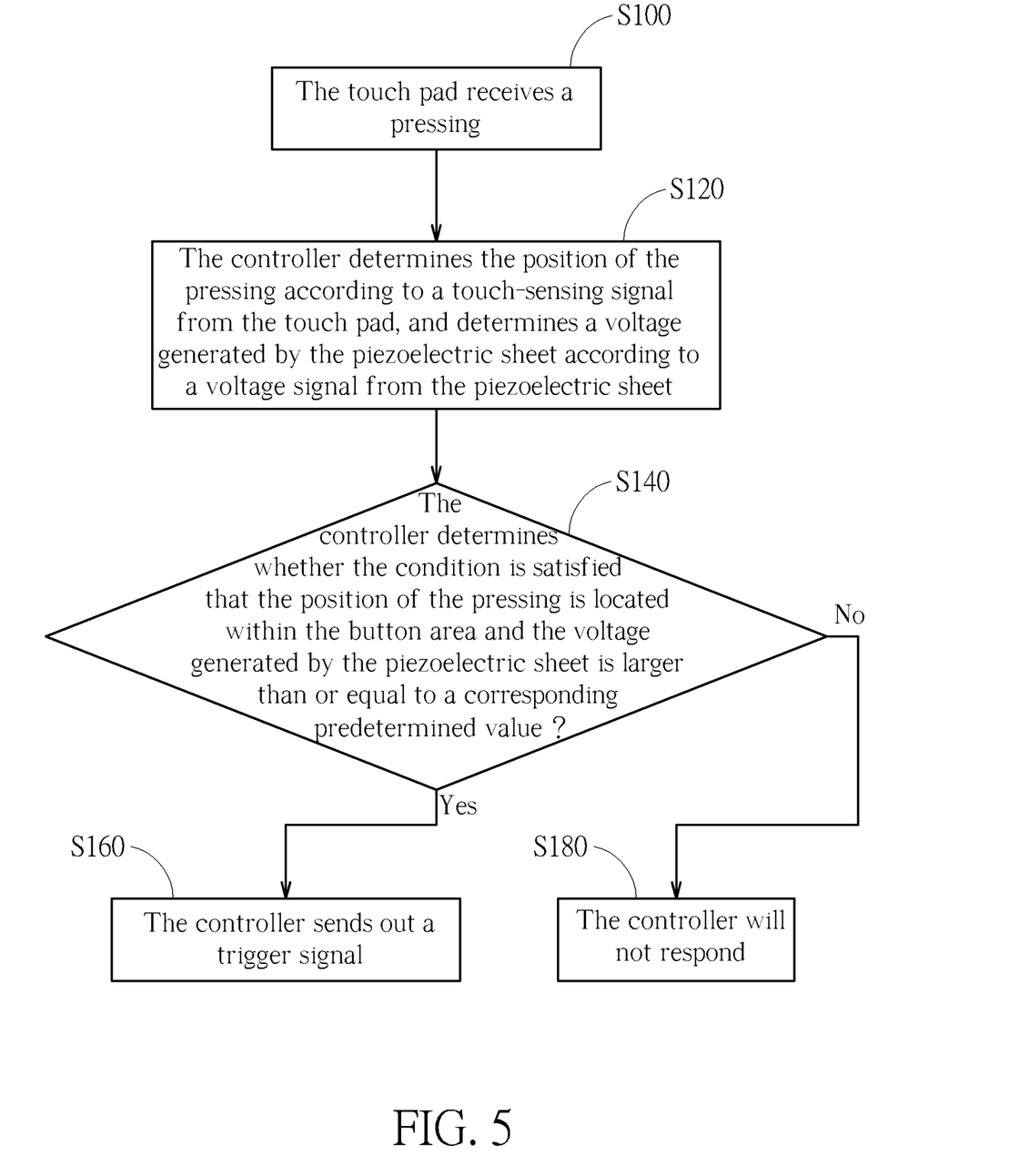
FIG. 5 is a flow chart of the input device responding to a pressing operation.

For the use of the input device 146, when the controller 1466 determines that a pressing is performed on the button area 14630 and the voltage generated by the piezoelectric sheet 1464 is larger than or equal to a corresponding predetermined value, the controller 1466 sends out a trigger signal. As shown by the flow chart in FIG. 5, the touch pad 1462 receives a pressing, as shown by the step S100. The controller 1466 determines the position of the pressing according to a touch-sensing signal from the touch pad 1462, and determines a voltage generated by the piezoelectric sheet 1464 according to a voltage signal from the piezoelectric sheet 1464, as shown by the step S120. The controller 1466 determines whether the condition is satisfied that the position of the pressing is located within the button area 14630 and the voltage generated by the piezoelectric sheet 1464 is larger than or equal to a corresponding predetermined value, as shown by the step S140. If the determination result of the step S140 is YES, the controller 1466 sends out a trigger signal, as shown by the step S160. If the determination result of the step S140 is NO, the controller 1466 will not respond (i.e. not sending signals), as shown by the step S180. Therein, in the embodiment, the button area 14630 is further divided into the left button sub-area 14632 and the right button sub-area 14634. Therefore, as shown by the step S160, the trigger signal corresponds to the position of the pressing. For example, when the position of the pressing is located within the left button sub-area 14632, the trigger signal represents triggering of the left button. When the position of the pressing is located within the right button sub-area 14634, the trigger signal represents triggering of the right button. After receiving the trigger signal, the processor 142 controls the display screen 122 to display images and makes other responses, such as displaying a pressed button icon, closing a window, opening an application and so on. The response of the processor 142 to the trigger signal depends on the design of the application in principle, but not limited thereto.

For example, when the user touch the button area 14630 at the position P6 in FIG. 3, the controller 1466 can determine the position P6 according to a touch-sensing signal from the touch pad 1462, and can determine whether the voltage generated by the piezoelectric sheet 1464 is larger than or equal to a predetermined value according to a voltage signal from the piezoelectric sheet 1464. Therein, in practice, because the position P6 is relatively close to the position P1, it is practicable to regard the predetermined value corresponding to the position P1 (i.e. 6V) as the predetermined value corresponding to the position P6, and determine whether the voltage generated by the piezoelectric sheet 1464 is larger than or equal to 6 volts. In another view, because the position P6 is located between the position P1 and the position 2, it is practicable to obtain the predetermined value by a interpolation method (based on the position P6 relative to the positions P1 and P2) on the predetermined values corresponding to the positions P1 and P2 (i.e. 6V and 3V), and determine whether the voltage generated by the piezoelectric sheet 1464 is larger than or equal to the obtained predetermined value. If the determination result is YES, the controller 1466 sends out a trigger signal representing triggering of the left button (because the position P6 is located within the left button sub-area 14632).

Figure 6:
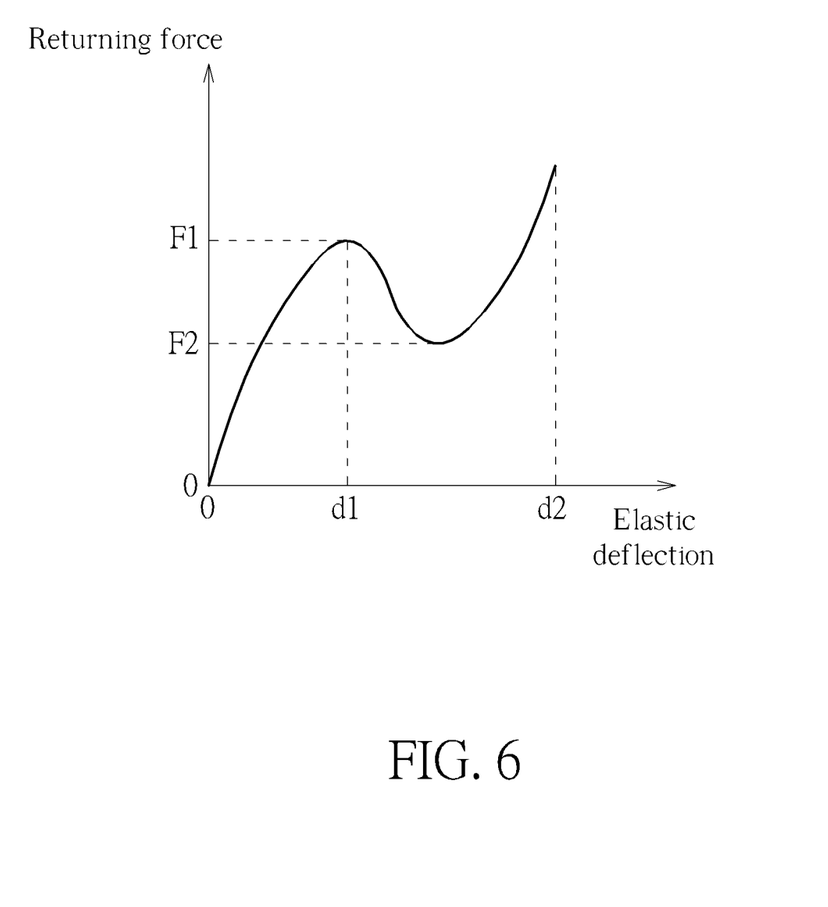
FIG. 6 is a graph illustrating a relation between returning force provided by an elastically supporting structure of the input device to the touch pad and elastic deflection of the touch pad.

In the embodiment, the input device 146 further includes an elastically supporting structure 1468 (indicated by a hatched block in FIG. 4) that is connected to the structural frame 1460 and the touch pad 1462. When the touch pad 1462 is elastically deflected, the elastically supporting structure 1468 provides the touch pad 1462 a returning force for returning the touch pad 1462. As shown by FIG. 6, the returning force varies as the elastic deflection of the touch pad 1462 varies. Therein, the elastic deflection of the touch pad 1462 can be presented by vertical displacement of the second side 14624 of the touch pad 1462. The vertical displacement is substantially equivalent to the displacement of the finger of the user pressing the button area 14630. The returning force has a local maximum F1, which corresponds to an elastic deflection d1. The returning force further has a local minimum F2. The difference between the local maximum F1 and the local minimum F2 can provide tactile feeling to the user when pressing the touch pad 1462. In practice, the reaction force that the user actually receives (i.e. the reaction force that is applied to the finger of the user due to the elastic deformation of the touch pad 1462) includes the returning force provided by the elastically supporting structure 1468 to the touch pad 1462 and the restoration force of the elastically deformed touch pad 1462. The restoration force is linear in principle. Therefore, the tactile feeling that the user actually receives (i.e. the feeling due to the changing of the pressing force) still depends on the difference between the local maximum F1 and the local minimum F2. Thereby, a required tactile feeling can be obtained by designing the difference between the local maximum F1 and the local minimum F2 in principle.

Figure 7:
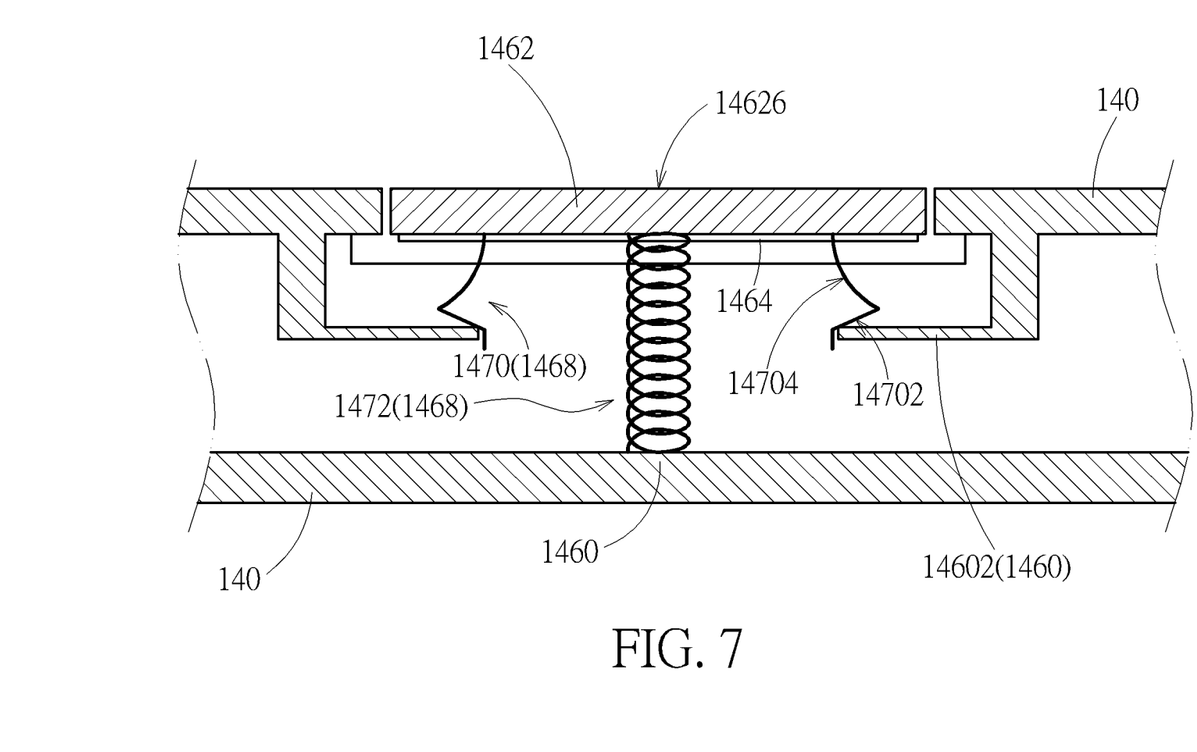
FIG. 7 is a sectional view of the input device along the line Y-Y in FIG. 1 according to an embodiment of the elastically supporting structure.
Figure 8:
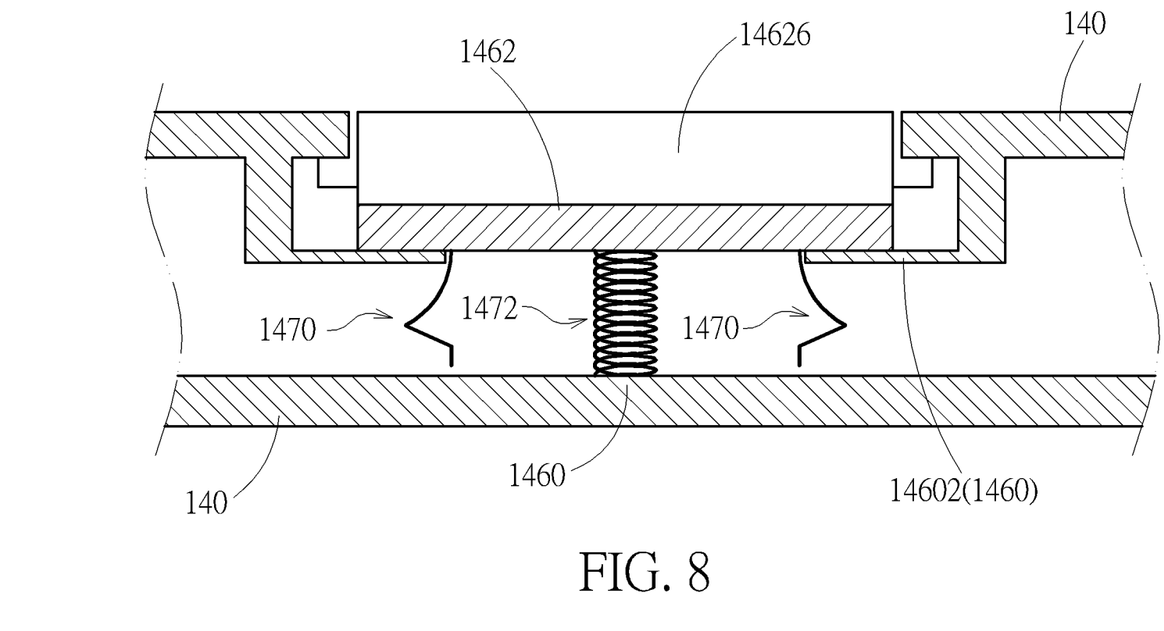
FIG. 8 is a sectional view of the input device in FIG. 7 with the touch pad being pressed down.

Please refer to FIG. 7 and FIG. 8. The elastically supporting structure 1468 in an embodiment is connected to the second side 14624 of the touch pad 1462 and includes two elastic arms 1470 and a spring 1472. The elastic arms 1470 are disposed oppositely. The spring 1472 is disposed between the two elastic arms 1470. Each elastic arm 1470 extends from the lower surface of the touch pad 1462 and includes an oblique section 14702 and a curved section 14704. The curved section 14704 is located between the oblique section 14702 and the touch pad 1462. The structural frame 1460 has two abutting portions 14602 corresponding to the two elastic arms 1470 respectively. When the touch pad 1462 is elastically deflected (e.g. the user pressing the touch pad 1462 downward), the oblique section 14702 and the curved section 14704 of the elastic arm 1470 slidably abut against the corresponding abutting portions 14602 (or the abutting portion 14602 relatively slidably abut against the corresponding oblique section 14702 and the corresponding curved section 14704), so that the elastic arms 1470 elastically deform (or elastically deflect). As shown by FIG. 7, the oblique section 14702 is a steep slope relative to the curved section 14704 while the curved section 14704 is a gentle slope relative to the oblique section 14702 (therein, the above gentle slope and the steep slope can be observed by an included angle of the curved section 14704 and a vertical line and an included angle of the oblique section 14702 and the vertical line). The elastically supporting structure 1468 shown in FIG. 7 can provide the touch pad 1462 a returning force (due to the restoration force of the elastic arm 1470 and the spring 1472) whose behavior is similar to FIG. 6. When the junction of the oblique section 14702 and the curved section 14704 slidably abuts against the abutting portion 14602 (or the abutting portion 14602 relatively slides over the junction of the oblique section 14702 and the curved section 14704), the returning force provided by the elastically supporting structure 1468 to the touch pad 1462 reaches the local maximum F1. Furthermore, in the embodiment, the abutting portion 14602 also serves as a stopping portion located corresponding to the button area 14630 (referring to FIG. 3) under the touch pad 1462. When the touch pad 1462 is pressed by the user to move downward until the touch pad 1462 is stopped by the abutting portion 14602 (as shown by FIG. 8), a corresponding elastic deflection d2 of the touch pad 1462 (as shown by FIG. 6) is equivalent to the stroke of the user pressing the button area 14630. When the user continues to apply force to the touch pad 1462 downward, the reaction force received by the user from the touch pad 1462 will rapidly increase because of the stopping effect of the abutting portion 14602. In addition, the elastic arm 1470 can be formed by bending an elastic sheet. Furthermore, the quantity of the elastic arms 1470 of the elastically supporting structure 1468 shown in FIG. 7 is but not limited to 2, for example one or more. Furthermore, the spring 1472 of the elastically supporting structure 1468 shown in FIG. 7 also can be omitted.

Figure 9:
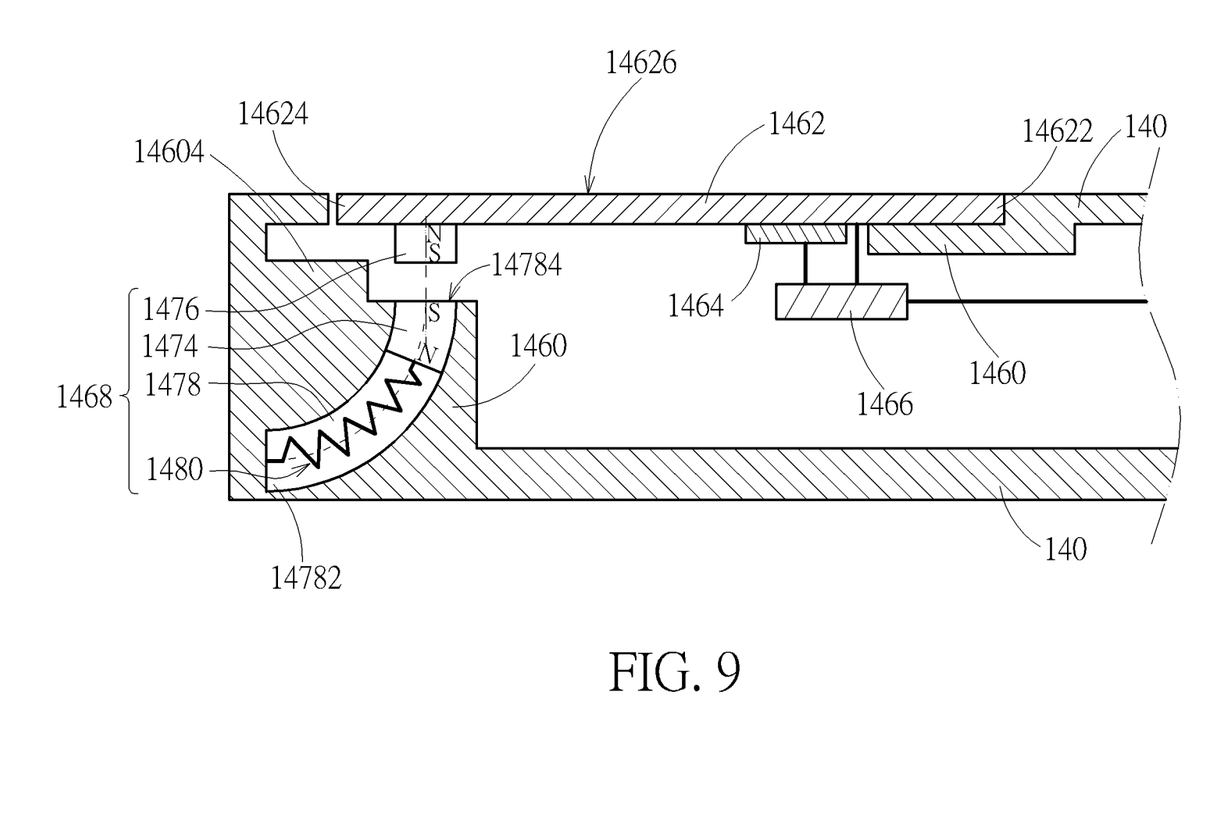
FIG. 9 is a sectional view of the input device along the line X-X in FIG. 1 according to another embodiment of the elastically supporting structure.
Figure 10:
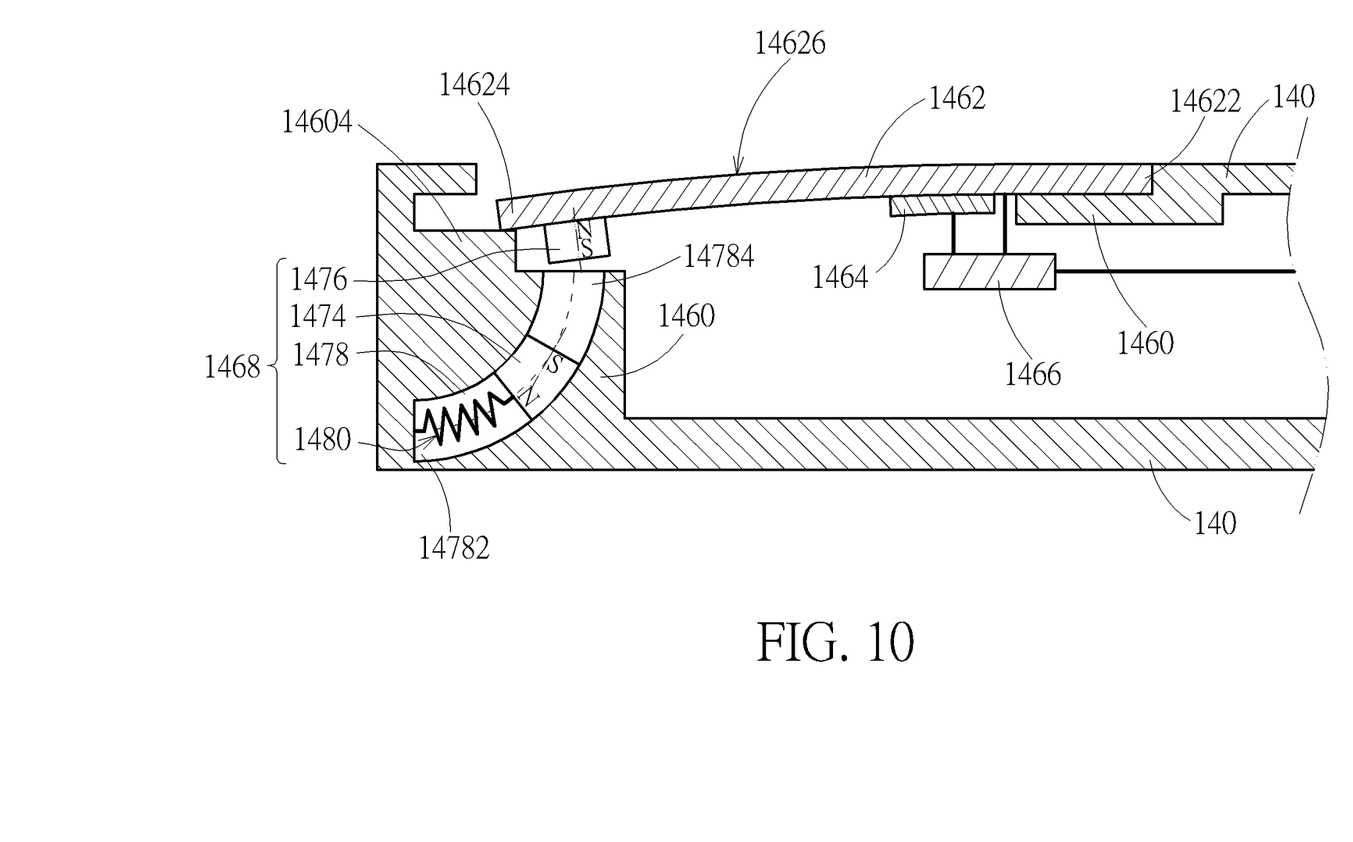
FIG. 10 is a sectional view of the input device in FIG. 9 with the touch pad being pressed down.

Please refer to FIG. 9 and FIG. 10. The elastically supporting structure 1468 in an embodiment is connected to the second side 14624 of the touch pad 1462 and includes a first magnet 1474, a second magnet 1476, a curved sliding channel 1478, and a spring 1480. The curved sliding channel 1478 is disposed on the structural frame 1460. The first magnet 1474 is slidably disposed in the curved sliding channel 1478. The spring 1480 is disposed in the curved sliding channel 1478 and is connected to the first magnet 1474 and the curved sliding channel 1478. In the embodiment, the curved sliding channel 1478 has a closed end 14782 and an open end 14784. The open end 14784 is toward the touch pad 1462. The spring 1480 is disposed between the closed end 14782 and the first magnet 1474. The second magnet 1476 is fixed on the touch pad 1462 corresponding to the first magnet 1474, so that the first magnet 1474 and the second magnet 1476 produce a repulsion force therebetween. In the embodiment, the extension path of the curved sliding channel 1478 (indicated by a dashed line in FIG. 9 and FIG. 10) has an extension direction at the open end 14784. The extension direction is perpendicular to the touch pad 1462. Before the touch pad 1462 is not elastically deflected (e.g. the user has not pressed the touch pad 1462 yet), the first magnet 1474 is located substantially above the open end 14784. At the moment, the movement directions (indicated by chain lines in FIG. 9 and FIG. 10) of the repulsion force driving the first magnet 1474 and the second magnet 1476 respectively coincide. When the user presses the touch pad 1462 downward, the second magnet 1476 approaches the first magnet 1474 so that the repulsion force increases. Simultaneously, the repulsion force starts to push the first magnet 1474 to slide downward along the curved sliding channel 1478. When an included angle of the movement directions of the first magnet 1474 and the second magnet 1476 increases (or the non-parallel degree of the movement directions increases), the repulsion force decreases. Therefore, the elastically supporting structure 1468 in FIG. 9 can provide the touch pad 1462 a returning force (due to the repulsion force) whose behavior is similar to FIG. 6. When the repulsion force produced between the first magnet 1474 and the second magnet 1476 varies from increasingly to decreasingly, the returning force of the elastically supporting structure 1468 to the touch pad 1462 reaches the local maximum F1. Furthermore, in the embodiment, the structural frame 1460 has a stopping portion 14604 corresponding to the button area 14630 (referring to FIG. 3) under the touch pad 1462. When the touch pad 1462 is pressed by the user to move downward until the touch pad 1462 is stopped by the stopping portion 14604 (as shown by FIG. 10), a corresponding elastic deflection d2 of the touch pad 1462 (as shown by FIG. 6) is equivalent to the stroke of the user pressing the button area 14630. When the user continues to apply force to the touch pad 1462 downward, the reaction force received by the user from the touch pad 1462 will rapidly increase because of the stopping effect of the stopping portion 14604.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input device, comprising:
   a structural frame, having an abutting portion;
   a touch pad having a first side, a second side, and a touch-sensitive surface, the first side and the second side being opposite, the first side being fixed on the structural frame, the touch-sensitive surface including a button area, the button area being located at the second side, the touch pad being elastically deflectable to move the second side relative to the structural frame;
   an elastically supporting structure, connected to the structural frame and the touch pad, the elastically supporting structure comprising an elastic arm, the elastic arm slidably abutting the abutting portion when the touch pad is elastically deflected;
   a piezoelectric sheet fixed on the touch pad, the piezoelectric sheet generating a voltage when the touch pad is elastically deflected; and
   a controller electrically connected to the touch pad and the piezoelectric sheet;
   wherein when the controller determines that a pressing is performed on the button area and the voltage is larger than or equal to a corresponding predetermined value, the controller sends out a trigger signal.

2. The input device according to claim 1, wherein when the touch pad is elastically deflected, the elastically supporting structure provides a returning force to the touch pad, and the returning force varies as the elastic deflection of the touch pad changes, so that the returning force has a local maximum.

3. The input device according to claim 2, wherein the elastically supporting structure is connected to the second side of the touch pad.

4. The input device according to claim 2, wherein the elastic arm extends from the touch pad and comprises an oblique section and a curved section, the curved section is located between the oblique section and the touch pad, and when the touch pad is elastically deflected, the oblique section and the curved section slidably abut the abutting portion.

5. The input device according to claim 4, wherein the quantity of the elastic arm is two, and the elastically supporting structure comprises a spring disposed between the two elastic arms.

6. The input device according to claim 1, wherein the piezoelectric sheet is close to the first side.

7. The input device according to claim 6, wherein the piezoelectric sheet is provided in a strip and extends parallel to the first side.

8. The input device according to claim 1, wherein the structural frame has a stopping portion disposed corresponding to the button area below the touch pad.

9. The input device according to claim 1, wherein the touch-sensitive surface comprises a movement area, and the button area is located between the movement area and the second side.

10. An input device, comprising:
    a structural frame;
    a touch pad having a first side, a second side, and a touch-sensitive surface, the first side and the second side being opposite, the first side being fixed on the structural frame, the touch-sensitive surface including a button area, the button area being located at the second side, the touch pad being elastically deflectable to move the second side relative to the structural frame;
    an elastically supporting structure, connected to the structural frame and the touch pad, the elastically supporting structure comprising a first magnet, a second magnet, a curved sliding channel, and a spring, the curved sliding channel being disposed on the structural frame, the first magnet being slidably disposed in the curved sliding channel, the spring being disposed in the curved sliding channel and connected to the first magnet and the curved sliding channel, the second magnet being fixed on the touch pad corresponding to the first magnet;
    a piezoelectric sheet fixed on the touch pad, the piezoelectric sheet generating a voltage when the touch pad is elastically deflected; and
    a controller electrically connected to the touch pad and the piezoelectric sheet;
    wherein when the controller determines that a pressing is performed on the button area and the voltage is larger than or equal to a corresponding predetermined value, the controller sends out a trigger signal.

11. The input device according to claim 10, wherein when the touch pad is elastically deflected, the elastically supporting structure provides a returning force to the touch pad, and the returning force varies as the elastic deflection of the touch pad changes, so that the returning force has a local maximum.

12. An electronic apparatus, comprising:
    a display screen;
    an input device, comprising:
        a structural frame, having an abutting portion;
        a touch pad having a first side, a second side, and a touch-sensitive surface, the first side and the second side being opposite, the first side being fixed on the structural frame, the touch-sensitive surface including a button area, the button area being located at the second side, the touch pad being elastically deflectable to move the second side relative to the structural frame;
        an elastically supporting structure, connected to the structural frame and the touch pad, the elastically supporting structure comprising an elastic arm, the elastic arm slidably abutting the abutting portion when the touch pad is elastically deflected;

a piezoelectric sheet fixed on the touch pad, the piezoelectric sheet generating a voltage when the touch pad is elastically deflected; and a controller electrically connected to the touch pad and the piezoelectric sheet, when the controller determines that a pressing is performed on the button area and the voltage is larger than or equal to a corresponding predetermined value, the controller sending out a trigger signal; and a processor electrically connected to the display screen and the controller of the input device, the processor receiving the trigger signal to control the display screen to display images.

13. The electronic apparatus according to claim 12, wherein when the touch pad is elastically deflected, the elastically supporting structure provides a returning force to the touch pad, and the returning force varies as the elastic deflection of the touch pad changes, so that the returning force has a local maximum.

14. The electronic apparatus according to claim 13, wherein the elastically supporting structure is connected to the second side of the touch pad.

15. The electronic apparatus according to claim 13, wherein the elastic arm extends from the touch pad and comprises an oblique section and a curved section, the curved section is located between the oblique section and the touch pad, and when the touch pad is elastically deflected, the oblique section and the curved section slidably abut the abutting portion.

16. The electronic apparatus according to claim 15, wherein the quantity of the elastic arm is two, and the elastically supporting structure comprises a spring disposed between the two elastic arms.

17. The electronic apparatus according to claim 12, wherein the piezoelectric sheet is close to the first side.

18. The electronic apparatus according to claim 17, wherein the piezoelectric sheet is provided in a strip and extends parallel to the first side.

19. The electronic apparatus according to claim 12, wherein the structural frame has a stopping portion disposed corresponding to the button area under the touch pad.

20. The electronic apparatus according to claim 12, wherein the touch-sensitive surface comprises a movement area, and the button area is located between the movement area and the second side.

21. An electronic apparatus, comprising:
a display screen;
an input device, comprising:
a structural frame;
a touch pad having a first side, a second side, and a touch-sensitive surface, the first side and the second side being opposite, the first side being fixed on the structural frame, the touch-sensitive surface including a button area, the button area being located at the second side, the touch pad being elastically deflectable to move the second side relative to the structural frame;
an elastically supporting structure, connected to the structural frame and the touch pad, the elastically supporting structure comprising a first magnet, a second magnet, a curved sliding channel, and a spring, the curved sliding channel being disposed on the structural frame, the first magnet being slidably disposed in the curved sliding channel, the spring being disposed in the curved sliding channel and connected to the first magnet and the curved sliding channel, the second magnet being fixed on the touch pad corresponding to the first magnet;
a piezoelectric sheet fixed on the touch pad, the piezoelectric sheet generating a voltage when the touch pad is elastically deflected; and
a controller electrically connected to the touch pad and the piezoelectric sheet, when the controller determines that a pressing is performed on the button area and the voltage is larger than or equal to a corresponding predetermined value, the controller sending out a trigger signal; and
a processor electrically connected to the display screen and the controller of the input device, the processor receiving the trigger signal to control the display screen to display images.

22. The electronic apparatus according to claim 21, wherein when the touch pad is elastically deflected, the elastically supporting structure provides a returning force to the touch pad, and the returning force varies as the elastic deflection of the touch pad changes, so that the returning force has a local maximum.

* * * * *